(12) United States Patent
Cai et al.

(10) Patent No.: US 9,117,877 B2
(45) Date of Patent: Aug. 25, 2015

(54) METHODS OF FORMING A DIELECTRIC CAP LAYER ON A METAL GATE STRUCTURE

(75) Inventors: Xiuyu Cai, Albany, NY (US); Ruilong Xie, Albany, NY (US); Jin Cho, Palo Alto, CA (US); John Iacoponi, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 156 days.

(21) Appl. No.: 13/350,908

(22) Filed: Jan. 16, 2012

(65) Prior Publication Data

US 2013/0181263 A1 Jul. 18, 2013

(51) Int. Cl.
 *H01L 21/311* (2006.01)
 *H01L 21/762* (2006.01)
 *H01L 29/78* (2006.01)
 *H01L 29/66* (2006.01)

(52) U.S. Cl.
 CPC .... *H01L 21/76232* (2013.01); *H01L 29/66795* (2013.01); *H01L 29/785* (2013.01)

(58) Field of Classification Search
 CPC .................................................. H01L 21/76232
 USPC ....................................................... 438/702
 See application file for complete search history.

(56) References Cited

U.S. PATENT DOCUMENTS

| 6,642,090 | B1 * | 11/2003 | Fried et al. ............... 438/164 |
| 7,955,913 | B2 | 6/2011 | Kim |
| 8,053,299 | B2 | 11/2011 | Xu |
| 8,497,177 | B1 * | 7/2013 | Chang et al. ............... 438/283 |
| 2006/0108647 | A1 * | 5/2006 | Yuan ............... 257/396 |
| 2006/0175669 | A1 * | 8/2006 | Kim et al. ............... 257/401 |
| 2007/0281493 | A1 * | 12/2007 | Fucsko et al. ............... 438/739 |
| 2008/0029828 | A1 * | 2/2008 | Oh et al. ............... 257/401 |
| 2008/0233699 | A1 | 9/2008 | Booth et al. |
| 2008/0265308 | A1 * | 10/2008 | Lee ............... 257/324 |
| 2009/0035909 | A1 | 2/2009 | Chang et al. |
| 2009/0104755 | A1 * | 4/2009 | Mallick et al. ............... 438/477 |
| 2009/0278196 | A1 * | 11/2009 | Chang et al. ............... 257/328 |
| 2011/0073919 | A1 | 3/2011 | Pawlak |
| 2011/0097889 | A1 * | 4/2011 | Yuan et al. ............... 438/595 |
| 2011/0233679 | A1 | 9/2011 | Chen et al. |
| 2011/0298098 | A1 | 12/2011 | Chang |
| 2011/0317485 | A1 * | 12/2011 | Liaw ............... 365/182 |
| 2012/0043597 | A1 | 2/2012 | Chen et al. |
| 2013/0078818 | A1 * | 3/2013 | Lin et al. ............... 438/761 |
| 2013/0320455 | A1 * | 12/2013 | Cappellani et al. .......... 257/368 |
| 2014/0065779 | A1 * | 3/2014 | Zhang et al. ............... 438/283 |
| 2014/0065794 | A1 * | 3/2014 | Kar et al. ............... 438/424 |

FOREIGN PATENT DOCUMENTS

CN 102130014 A * 7/2011

* cited by examiner

*Primary Examiner* — Matthew Landau
*Assistant Examiner* — Igwe U Anya
(74) *Attorney, Agent, or Firm* — Amerson Law Firm, PLLC

(57) ABSTRACT

Disclosed herein are various methods of forming isolation structures on FinFETs and other semiconductor devices, and the resulting devices that have such isolation structures. In one example, the method includes forming a plurality of spaced-apart trenches in a semiconducting substrate, wherein the trenches define a fin for a FinFET device, forming a layer of insulating material in the trenches, wherein the layer of insulating material covers a lower portion of the fin but not an upper portion of the fin, forming a protective material on the upper portion of the fin, and performing a heating process in an oxidizing ambient to form a thermal oxide region on the covered lower portion of the fin.

12 Claims, 9 Drawing Sheets

METHODS OF FORMING A DIELECTRIC CAP LAYER ON A METAL GATE STRUCTURE

BACKGROUND OF THE INVENTION

1. Field of the Invention

Generally, the present disclosure relates to the manufacturing of sophisticated semiconductor devices, and, more specifically, to various methods of forming isolation structures on FinFETs and other semiconductor devices, and the resulting devices that have such isolation structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide. One technique used to form STI structures initially involves growing a pad oxide layer on the substrate and depositing a pad nitride layer on the pad oxide layer. Thereafter, using traditional photolithography and etching processes, the pad oxide layer and the pad nitride layer are patterned. Then, an etching process is performed to form trenches in the substrate for the STI structure using the patterned pad oxide layer and pad nitride layer as an etch mask. Thereafter, a deposition process is performed to overfill the trenches with an insulating material such as silicon dioxide. A chemical mechanical polishing (CMP) process is then performed using the pad nitride layer as a polish-stop layer to remove the excess insulation material. Then, a subsequent deglazing (etching) process may be performed to insure that the insulating material is removed from the surface of the pad nitride layer. This deglaze process removes some of the STI structures.

As device dimensions have continued to shrink, the aspect ratio (height/width) of many openings, such as trenches for STI structures, or trenches that define fins for FinFET devices, have become larger, making such openings difficult to fill with an insulating material without forming undesirable voids. One material that has been employed in such applications is a flowable oxide material. As part of forming such a material, a relatively high-temperature (about 600° C. or greater) anneal process in an oxidation ambient is typically performed. However, this process may cause an unacceptable consumption of adjacent silicon material, e.g., in the case of a FinFET, it may make the fins too thin or at least it may change the thickness of the fins from what is intended by the design process. Such variations can lead to reduced device performance levels.

The present disclosure is directed to various methods of forming isolation structures on FinFETs and other semiconductor devices, and the resulting devices that have such isolation structures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation structures on FinFETs and other semiconductor devices, and the resulting devices that have such isolation structures. In one example, the method includes forming a plurality of spaced-apart trenches in a semiconducting substrate, wherein the trenches define a fin for a FinFET device, forming a layer of insulating material in the trenches, wherein the layer of insulating material covers a lower portion of the fin but not an upper portion of the fin, forming a protective material on the upper portion of the fin, and performing a heating process in an oxidizing ambient to form a thermal oxide region on the covered lower portion of the fin.

In another illustrative example, a method of forming a FinFET device is disclosed that includes the steps of forming a plurality of spaced-apart trenches in a semiconducting substrate, wherein the trenches define a fin for the device, forming a layer of flowable oxide material in the trenches, wherein the layer of flowable oxide material covers a lower portion of the fin but not an upper portion of the fin, forming at least one sidewall spacer adjacent opposite sides of the upper portion of the fin and performing a heating process in an oxidizing ambient to form a thermal oxide region on the covered lower portion of the fin.

BRIEF DESCRIPTION OF THE DRAWINGS

The disclosure may be understood by reference to the following description taken in conjunction with the accompanying drawings, in which like reference numerals identify like elements, and in which.

Figure 1A:
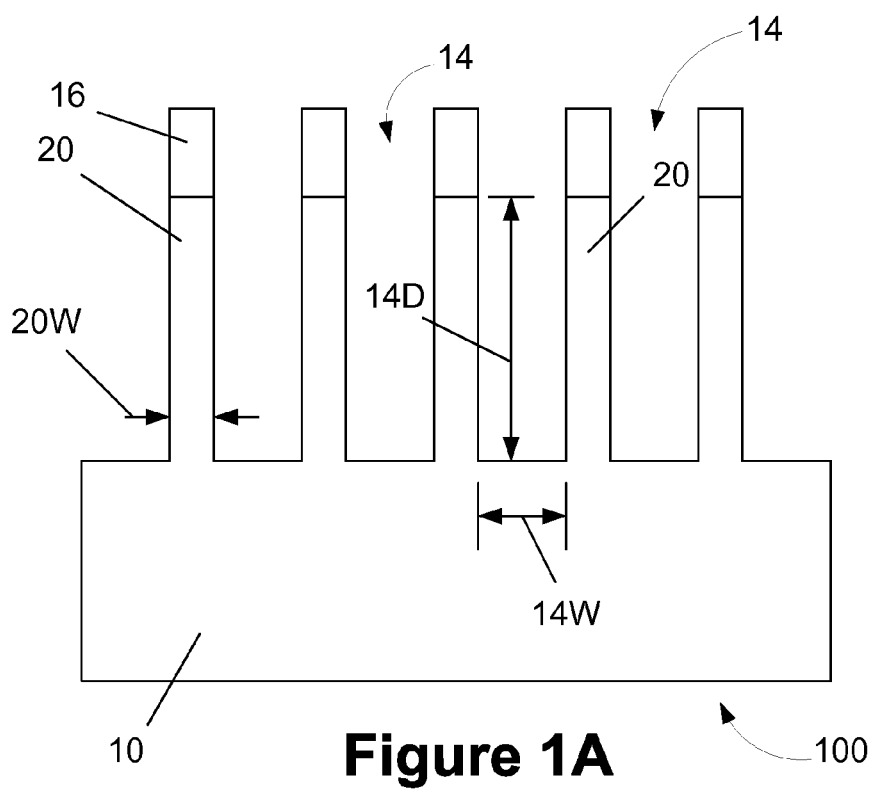
FIGS. 1A-1G depict one illustrative method disclosed herein for forming isolation structures on an illustrative FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming isolation structures on FinFETs and other semiconductor devices, and the resulting devices that have such isolation structures. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative FinFET semiconductor device 100 at an early stage of manufacturing that is formed above a semiconducting substrate 10. The substrate 10 may have a variety of configurations, such as the depicted bulk silicon configuration. The substrate 10 may be made of silicon or it may be made of materials other than silicon. At the point of fabrication depicted in FIG. 1A, a patterned mask layer 16, such as a patterned hard mask layer, has been formed above the substrate 10 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the substrate 10 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a hard mask layer of silicon nitride that is initially formed by performing a CVD process and thereafter patterned using known sidewall image transfer techniques and/or photolithographic techniques combined with performing known etching techniques.

With continuing reference to FIG. 1A, an etching process, such as a dry or wet etching process, is performed on the substrate 10 through the patterned mask layer 16 to form a plurality of trenches 14. This etching process results in the definition of a plurality of fins 20. The overall size, shape and configuration of the trenches 14 and fins 20 may vary depending on the particular application. The depth 14D and width 14W of the trenches 14 may vary depending upon the particular application. In one illustrative embodiment, based on current day technology, the depth 14D of the trenches 14 may range from approximately 30-150 nm and the width 14W of the trenches 14 may range from about 20-50 nm. In some embodiments, the fins 20 may have a width 20W within the range of about 5-30 nm. In the illustrative example depicted in FIGS. 1A-1G, the trenches 14 and fins 20 are all of a uniform size and shape. However, as discussed more fully below, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1B:
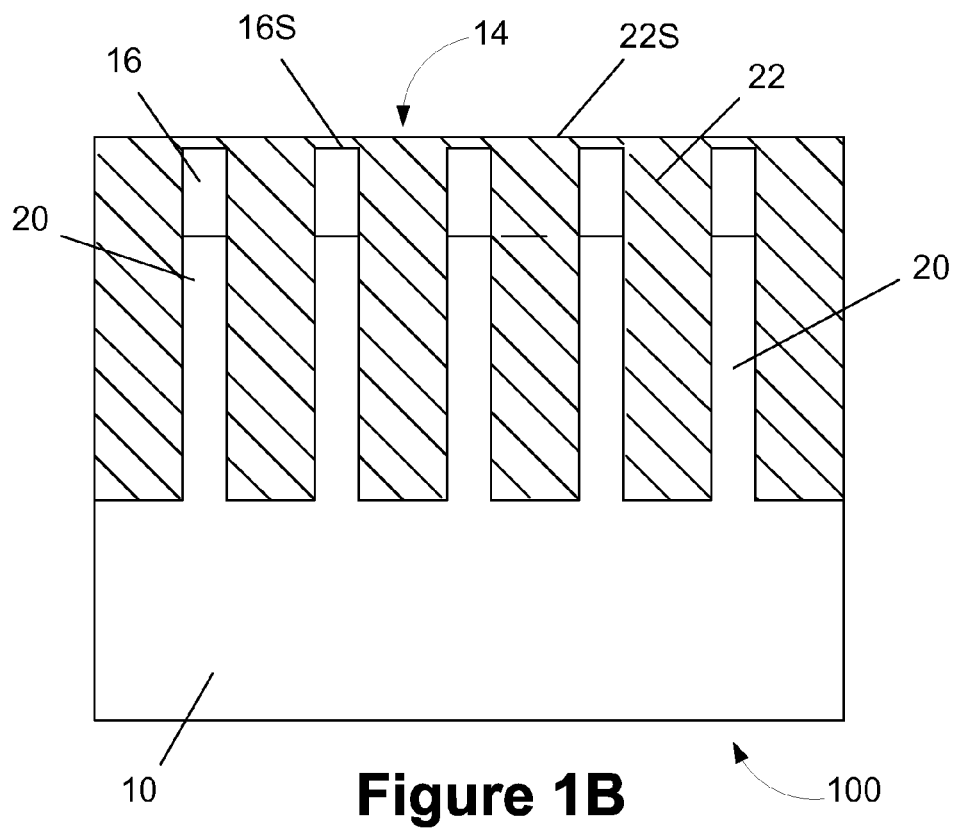

Then, as shown in FIG. 1B, a layer of insulating material 22 is formed in the trenches 14 of the device. The layer of insulating material 22 may be comprised of a variety of different material, such as silicon dioxide, etc., and it may be formed by performing a variety of techniques, e.g., CVD, spin-coating, etc. In one illustrative embodiment, the layer of insulating material 22 may be a flowable oxide material that is formed by performing a CVD process. Such a flowable oxide material is adapted for use with fins 20 of different configurations, even fins 20 with a reentrant profile. In the example depicted in FIG. 1B, the surface 22S of the layer of insulating material 22 is the "as-deposited" surface of the layer 22. In this example, the surface 22S of the layer of insulating material 22 may be positioned slightly above the upper surface 16S of the mask layer 16. Alternatively, if desired, a chemical mechanical polishing (CMP) process may be performed to planarize the surface 22S using the mask layer 16 as a polish-stop layer. After such a CMP process, the surface 22S of the layer of insulating material 22 would be substantially level with the surface 16S of the mask layer 16.

Figure 1C:
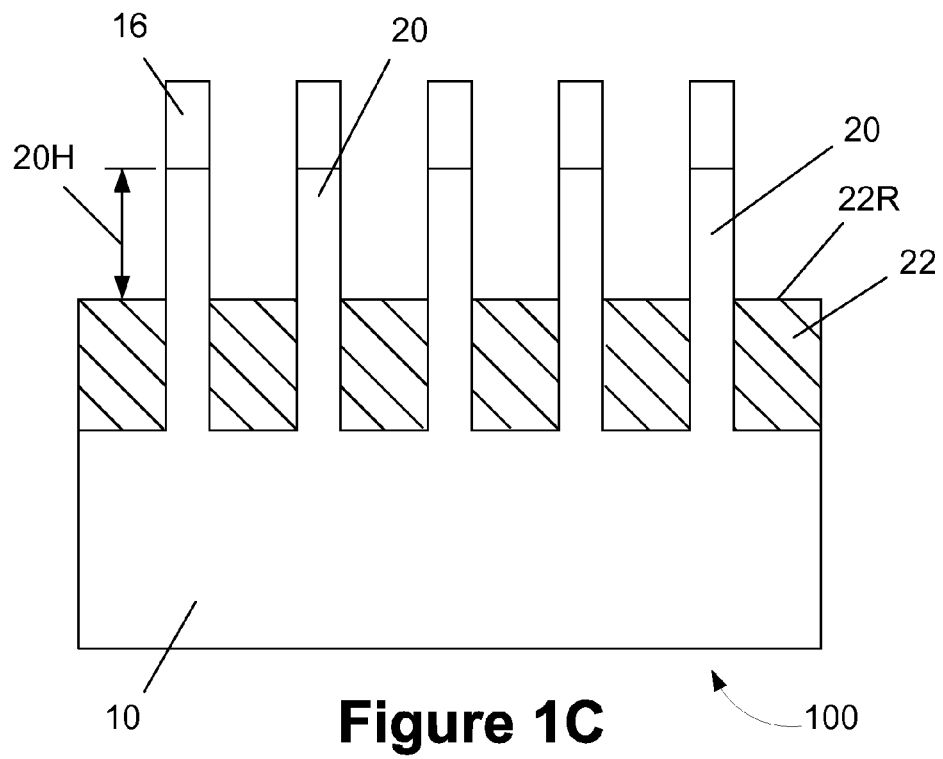

FIG. 1C depicts the device 100 after the layer of insulating material 22 has been recessed and has a recessed surface 22R. The layer of insulating material 22 covers a lower portion of the fins 20 while exposing an upper portion of the fins 20. In one example, starting with the device depicted in FIG. 1B, the layer of insulating material 22 may be recessed by simply performing an etching process on the as-deposited layer of insulating material 22. Alternatively, a CMP process may be performed on the layer of insulating material 22 prior to performing such an etching process if desired. The recessed layer of insulating material 22 essentially defines the final fin height 20H of the fins 20. The fin height 20H may vary depending upon the particular application and, in one illustrative embodiment, may range from about 5-50 nm. As an alternative to achieving the recessed layer of insulating material 22 shown in FIG. 1C by performing an etching process, the layer of insulating material 22 may be deposited to the desired thickness depicted in FIG. 1C by using a relatively new Novellus flowable oxide process, wherein the surface 22R would be an "as-deposited" process. At least some aspects of the aforementioned Novellus process are believed to be disclosed in U.S. Pat. No. 7,915,139, which is hereby incorporated by reference in its entirety. In general, the Novellus process is a relatively low-temperature process whereby the precursor material used in the process flows to the lowest level in the structure—in this case the bottom of the trenches 14. The parameters of the deposition process, such as the length of the deposition process, determine the final thickness of the deposited layer of material.

Figure 1D:
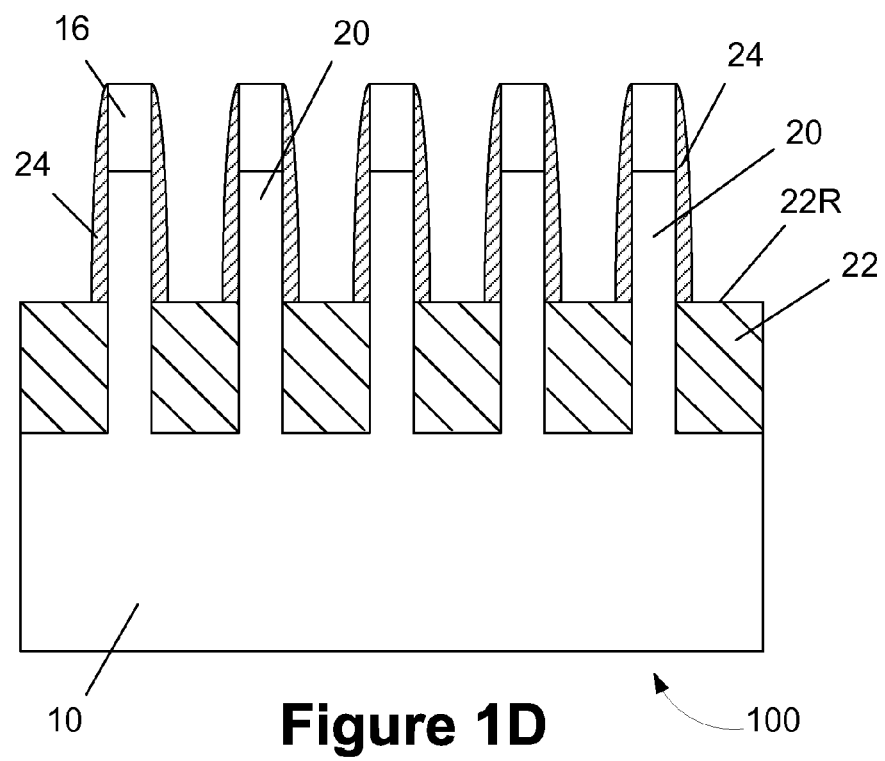

Next, as shown in FIG. 1D, a protective material is formed on the exposed upper portions of the fins 20. In one illustrative embodiment, the protective material takes the form of illustrative sidewall spacers 24 that are formed adjacent the fins 20. The spacers 24 may be comprised of a variety of different materials, such as silicon nitride. The spacers 24 may be formed by depositing a layer of spacer material and thereafter performing an anisotropic etching process.

Figure 1E:
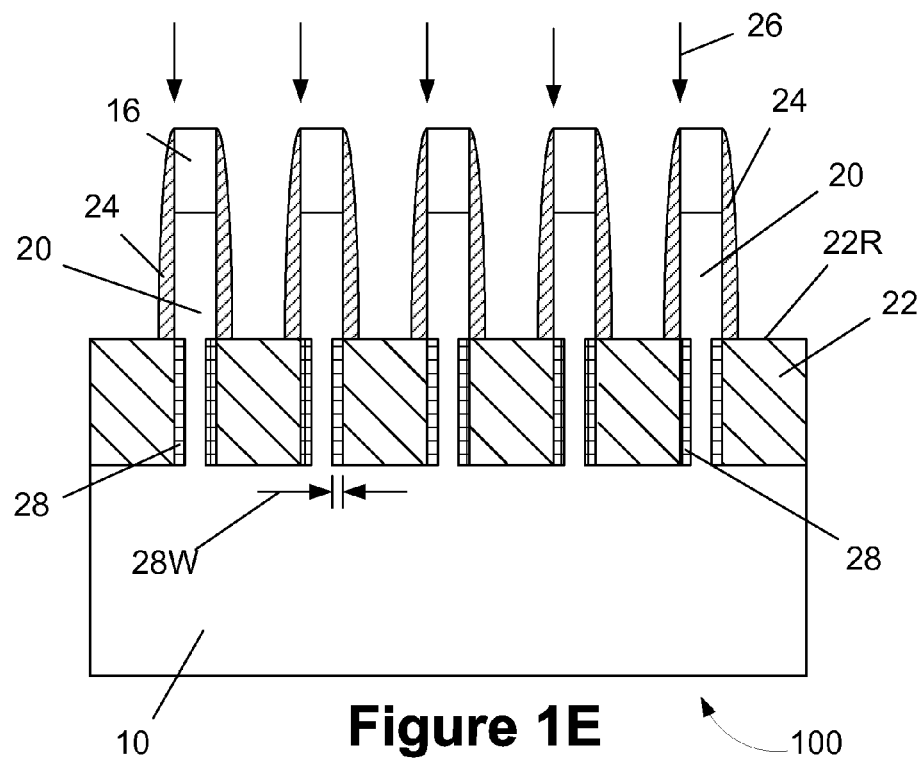
Figure 1F:
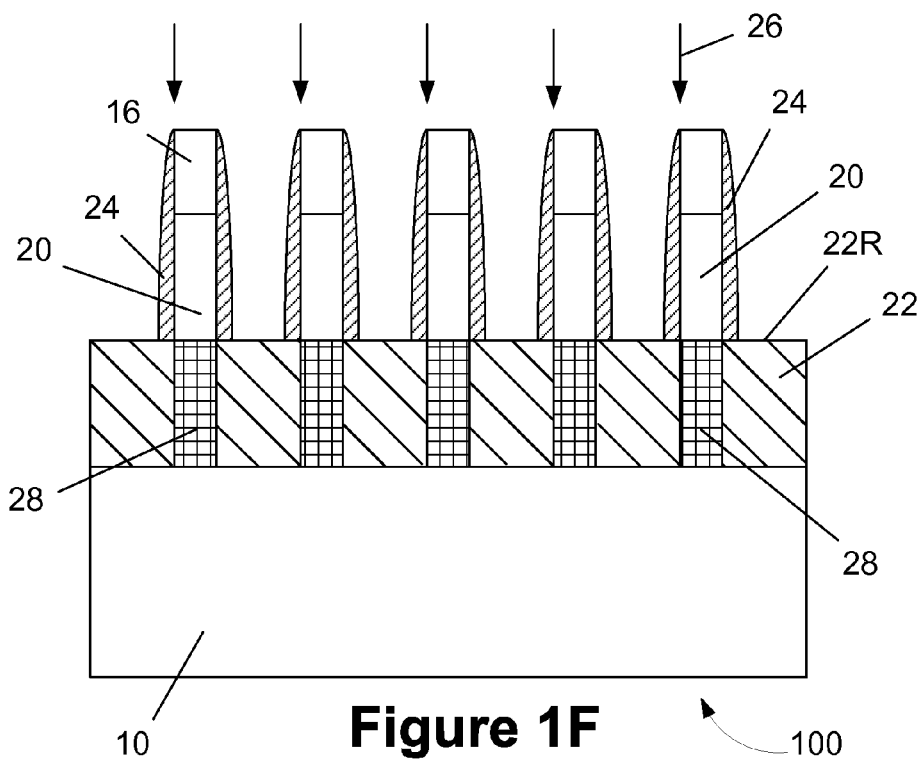

Next, as shown in FIGS. 1E-1F, a heating process 26 is performed to oxidize a portion (FIG. 1E) or all (Figure F) of the original fin 20 that is covered by the layer of insulating material 22 and to densify the layer of insulating material 22. More specifically, the heating process 26 may be performed in a furnace in an oxidation ambient, for example an ambient that contains steam and/or oxygen or any of a variety of other oxidation gases, so as to form the thermal oxide isolation regions 28 depicted in FIGS. 1E-1F and to generally densify the layer of insulating material 22. The steam can penetrate the relatively porous layer of insulating material 22 and thereby supply the needed oxygen for the growth of the thermal oxide isolation regions 28. In the illustrative example depicted in FIG. 1E, the thermal oxide isolation regions 28 may have a width or thickness 28W that falls within the range of about 1-5 nm. In the example depicted in FIG. 1F, substantially the entire thickness of the covered portion of the fin 20 may be converted to a thermal oxide isolation region 28. The temperature, pressure and duration of the heating process 26 may be adjusted or tuned so that the desired thickness of the thermal oxide isolation region 28 may be formed on the covered portions of the fins 20. In one illustrative example, where it is desired to form thermal oxide isolation regions 28 of a desired thickness (like the example depicted in FIG. 1E), the temperature of the process may be relatively low, e.g., about 400-600° C., and the pressure may be about 760 Torr, to provide better control as to the thickness 28W of the thermal oxide isolation regions 28. In the case wherein it is decided that substantially all of the covered portions of the fins 20 will be converted to a thermal oxide isolation region 28, the heating process may be performed at a relatively higher temperature, e.g., about 600-1000° C., and at a pressure of about 760 Torr.

Figure 1G:
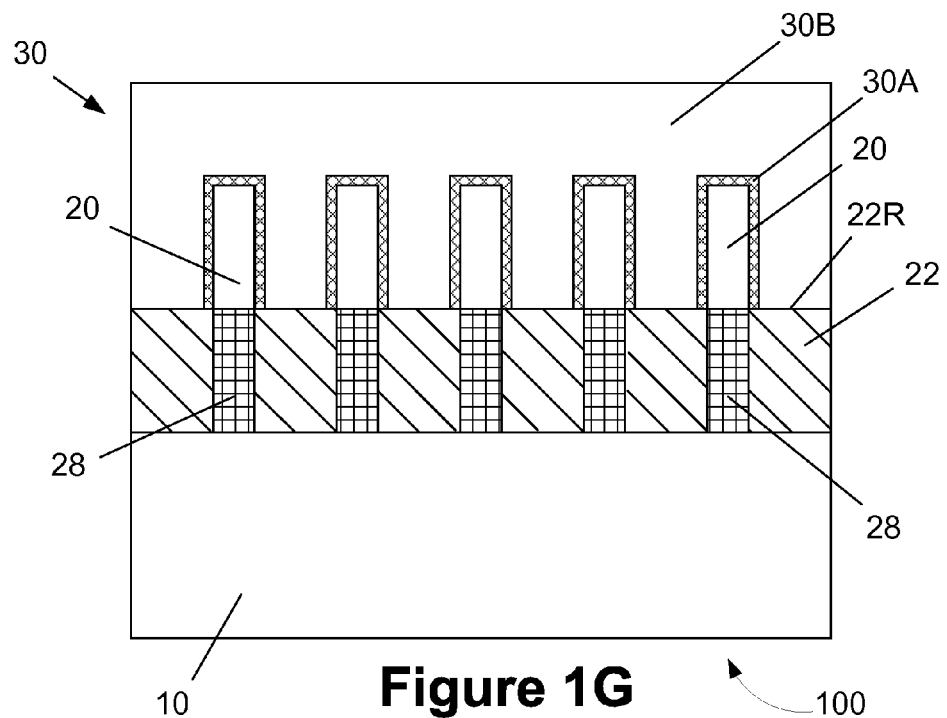

After the isolation regions 28 are formed, the illustrative FinFET device 100 may be completed using traditional fabrication techniques. For example, FIG. 1G depicts the device 100 after one or more etching processes have been performed to remove the sidewall spacers 24 and the hard mask 16 and an illustrative gate structure 30 has been formed for the device 100. In one illustrative embodiment, the schematically depicted gate structure 30 includes an illustrative gate insulation layer 30A and an illustrative gate electrode 30B. The gate insulation layer 30A may be comprised of a variety of different materials, such as, for example, silicon dioxide, a so-called high-k (k greater than 5) insulation material (where k is the relative dielectric constant), etc. Similarly, the gate electrode 30B may also be of a material such as polysilicon or amorphous silicon, or it may be comprised of one or more metal layers that act as the gate electrode 30B. As will be recognized by those skilled in the art after a complete reading of the present application, the gate structure 30 of the device 100 depicted in the drawings, i.e., the gate insulation layer 30A and the gate electrode 30B, is intended to be representative in nature. That is, the gate structure 30 may be comprised of a variety of different materials and it may have a variety of configurations, and the gate structure 30 may be made using either so-called "gate-first" or "gate-last" techniques. In one illustrative embodiment, an oxidation process may be performed to form a gate insulation layer 30A comprised of silicon dioxide. Thereafter, the gate electrode material 30B and a gate cap layer of material (not shown) may be deposited above the device 100 and the layers may be patterned using known photolithographic and etching techniques. In the example depicted in FIG. 1G, the thermal oxide isolation regions 28 are depicted as being isolation regions that consumed substantially all of the portions of the original fins 20 covered by the layer of insulating material 22.

Figure 2A:
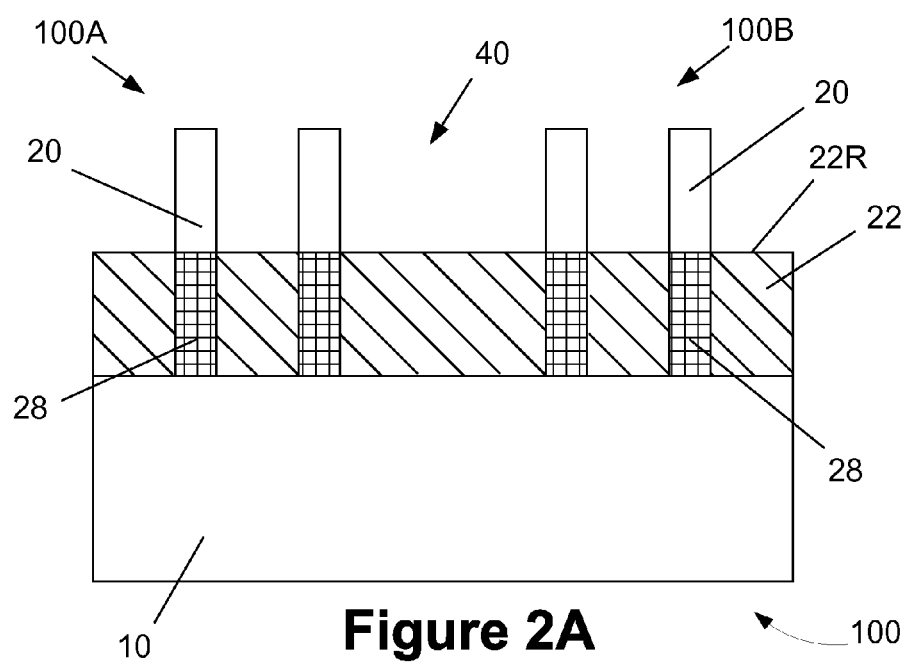
FIGS. 2A-2F depict another illustrative method disclosed herein for forming isolation structures on a FinFET device.

FIGS. 2A-2F depict one illustrative process flow wherein an isolation structure may be formed in a region 40 to separate two illustrative FinFET devices 100A, 100B. In FIG. 2A, the devices 100A, 100B are depicted at the point of fabrication wherein the illustrative thermal oxide isolation regions 28 have been formed. For illustration purposes, the devices 100A, 100B will be depicted as having thermal oxide isolation regions 28 that consumed substantially all of the portions of the original fins 20 covered by the layer of insulating material 22. Of course, if desired, the devices could have isolation regions 28 like those shown in FIG. 1E. Moreover, in some cases, the methods disclosed herein may be performed to form isolation regions between the devices 100A, 100B, where those devices do not have any thermal oxide isolation regions 28, like those described above.

Figure 2B:
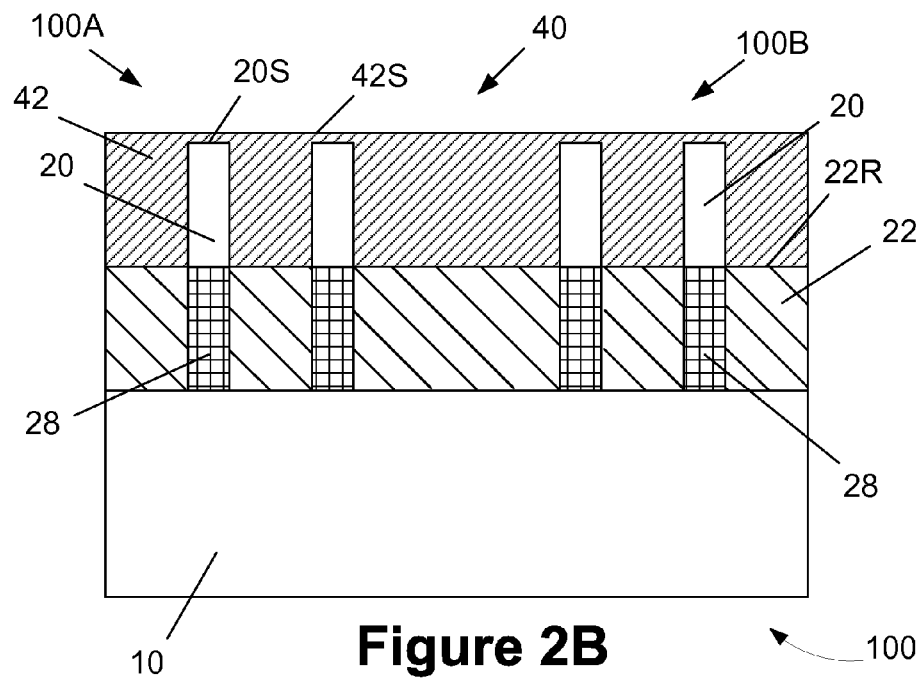

Then, as shown in FIG. 2B, a layer of material 42 is formed above the layer of insulating material 22 so as to cover and protect the exposed portions of the fins 20. The layer of material 42 may be comprised of a variety of different materials, such as silicon nitride, etc., and it may be formed by performing a variety of techniques, e.g., CVD. In the example depicted in FIG. 2B, the surface 42S of the layer of material 42 is the "as-deposited" surface of the layer 42. In this example, the surface 42S of the layer of material 42 may be positioned slightly above the upper surface 20S of the fins 20. Alternatively, if desired, a chemical mechanical polishing (CMP) process may be performed to planarize the surface 42S using the fins 20 as a polish-stop layer. After such a CMP process, the surface 42S of the layer of material 42 would be substantially level with the surface 20S of the fins 20.

Figure 2C:
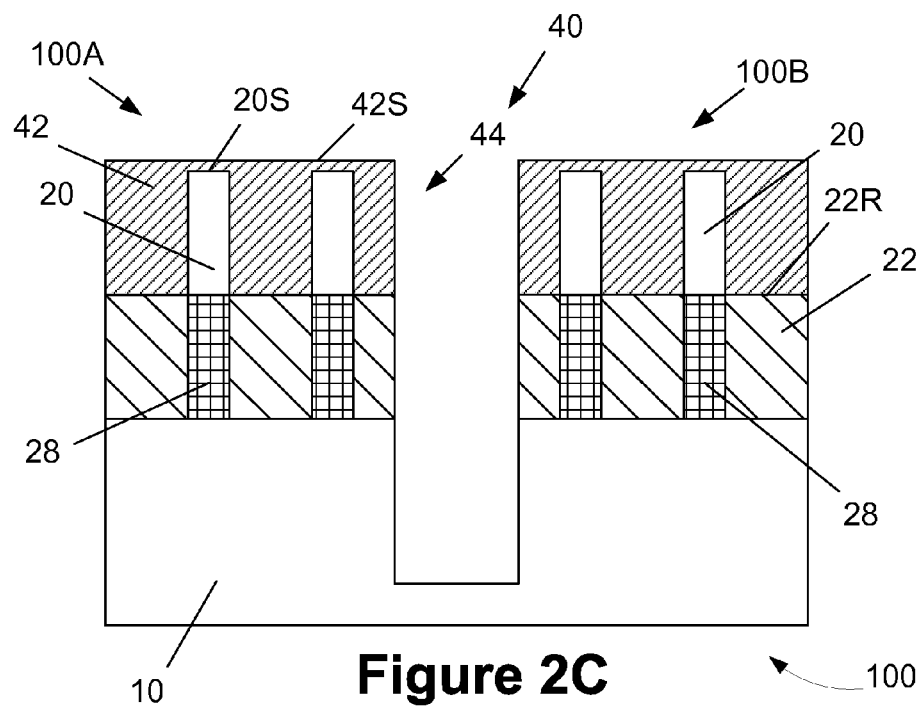

Next, as shown in FIG. 2C, a trench 44 is formed in the device 100. The trench 44 may be formed by performing one or more etching processes through a patterned mask layer (not shown), such as a photoresist mask, to define the trench 44 that extends into the substrate 10. The depth and width of the trench 44 may vary depending upon the particular applications.

Figure 2D:
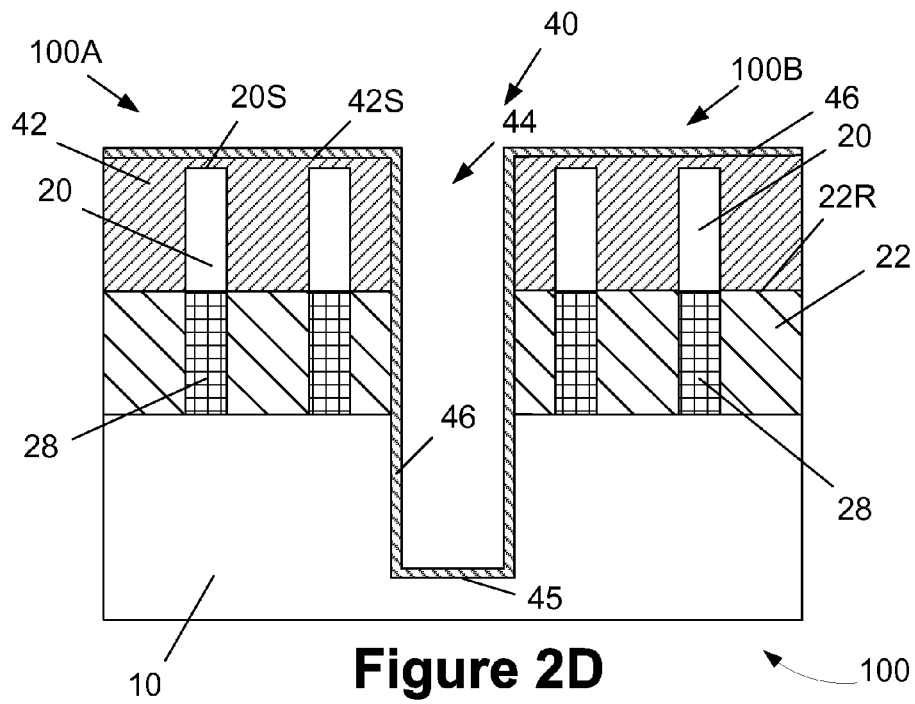

Then, as shown in FIG. 2D, a layer of insulating material 46 is conformably deposited in the trench 44. The layer of insulating material 46 may be comprised of a variety of different materials, such as silicon nitride, etc., and it may be formed by performing a variety of techniques, e.g., a conformal CVD process. The thickness of the layer of material 46 may vary depending upon the particular application, e.g., it may have a thickness that ranges from about 2-10 nm. In the depicted example, the layer of insulating material 46 covers the bottom 45 of the trench 44. In some cases, if desired, the portion of the layer of insulating material 46 at the bottom 45 of the trench 44 may be removed by performing a dry anisotropic etching process to thereby essentially define sidewall spacers (not shown) on the sidewalls of the trench 44.

Figure 2E:
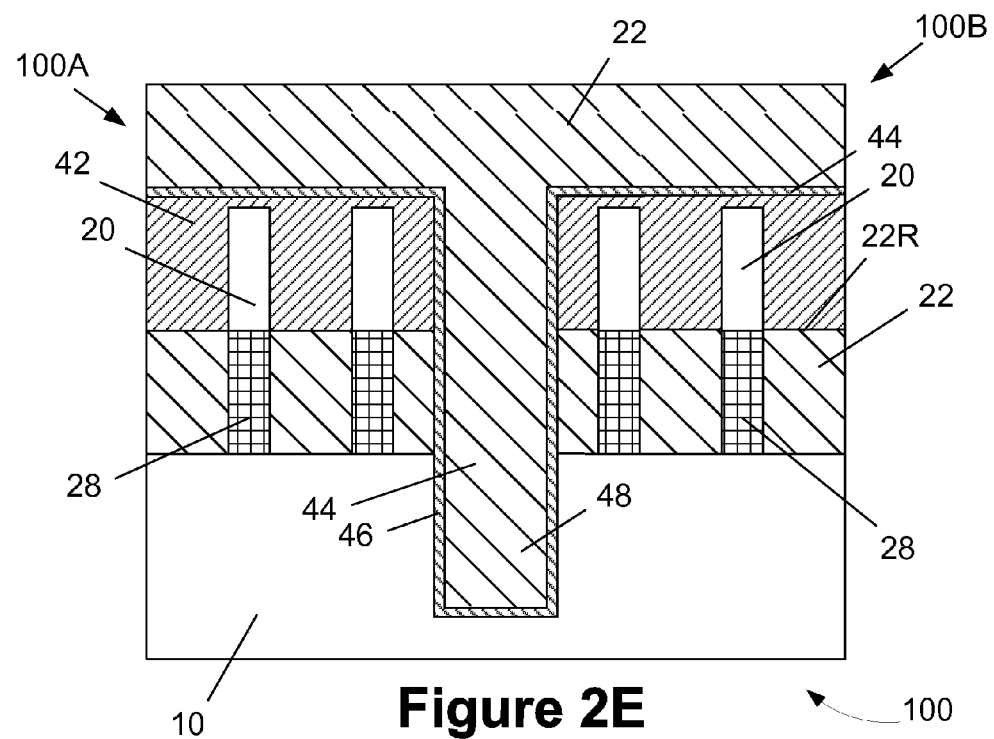
Figure 2F:
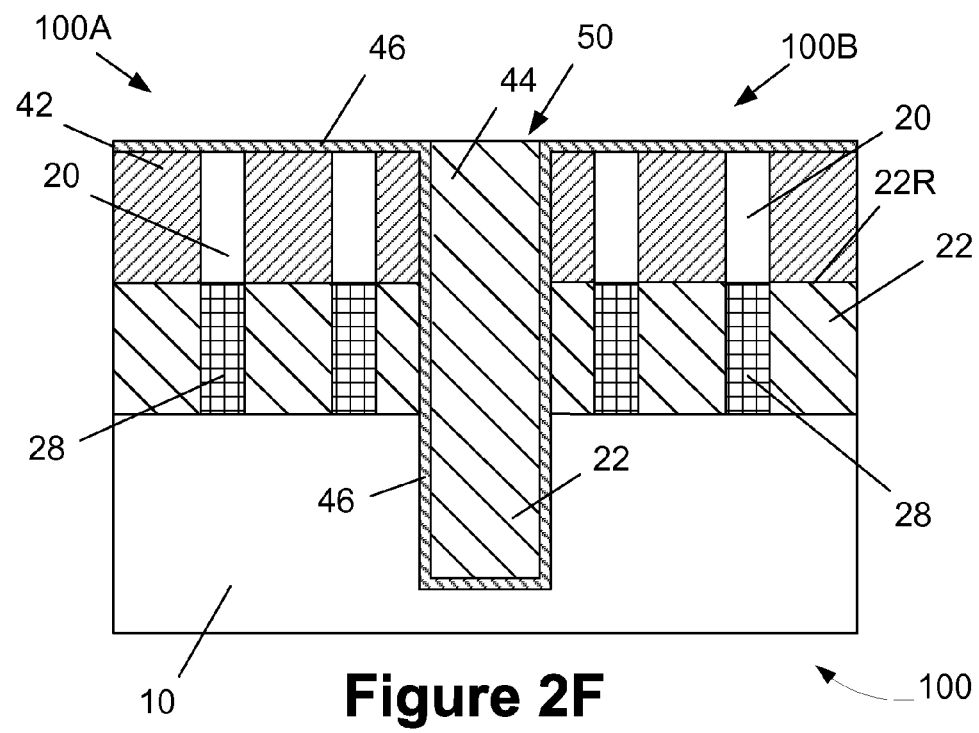

Thereafter, as shown in FIG. 2E, the insulating material 22 (described above) may be deposited so as to overfill the trench 44. Next, as shown in FIG. 2F, a CMP process is performed to remove excess portions of the insulating material 22 positioned outside of the trench 44. Alternatively, the Novellus process described above could be employed in forming the material 22 in the trench 44. At some point after the insulating material 22 is positioned in the trench 44, the heating process 26 described above (FIGS. 1E-1F) may be performed at a temperature of about 300-1000° C. to densify the insulating material 22. The final isolation structure 50 is shown in FIG. 2F.

Figure 3A:
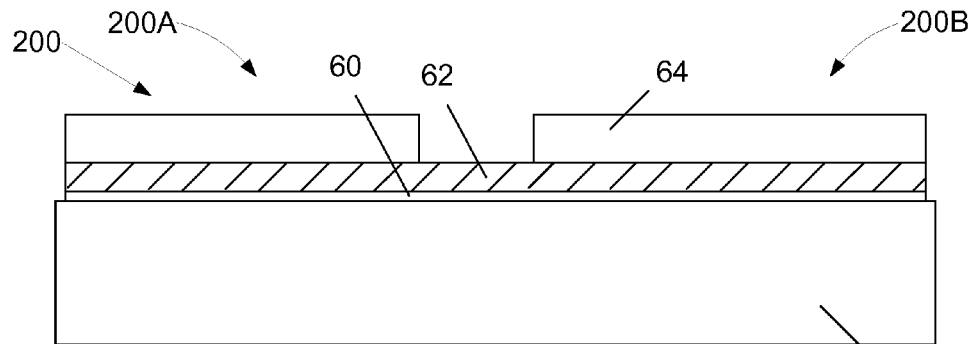
FIGS. 3A-3F depict another illustrative process flow disclosed herein for forming isolation structures on a planar semiconductor device.

The method disclosed herein may also be employed to form isolation structures 50 for semiconductors other than the illustrative FinFET devices 100A, 100B discussed above in FIGS. 2A-2F. For example, FIGS. 3A-3F depict one illustrative process flow for forming the isolation structure 50 (see FIG. 3F) for a device 200 that can be used to isolate two substantially planar semiconductor devices 200A, 200B (indicated by arrows only in FIG. 3A, since they may not be formed until after the isolation structure 50 is formed in the substrate 10), such as transistors, memory cells, etc. FIG. 3A is a simplified view of such an illustrative semiconductor device 200 at an early stage of manufacturing. The semiconductor device 200 is formed above the illustrative bulk semiconducting substrate 10 described previously. The substrate 10 may also be made of materials other than silicon.

In FIG. 3A, the device 200 is depicted at the point of fabrication where an illustrative screen or pad oxide layer 60 and an illustrative pad nitride layer 62 have been formed above the substrate 10. Also depicted in FIG. 3A is a patterned mask layer 64, e.g., a patterned photoresist mask that may be formed using traditional photolithography tools and techniques. In one illustrative example, the pad oxide layer 60 may have a thickness on the order of about 10 nm, and it may be formed by performing a thermal growth process. In one illustrative example, the pad nitride layer 62 may have a thickness on the order of about 80 nm, and it may be formed by performing a chemical vapor deposition (CVD) process.

Figure 3B:
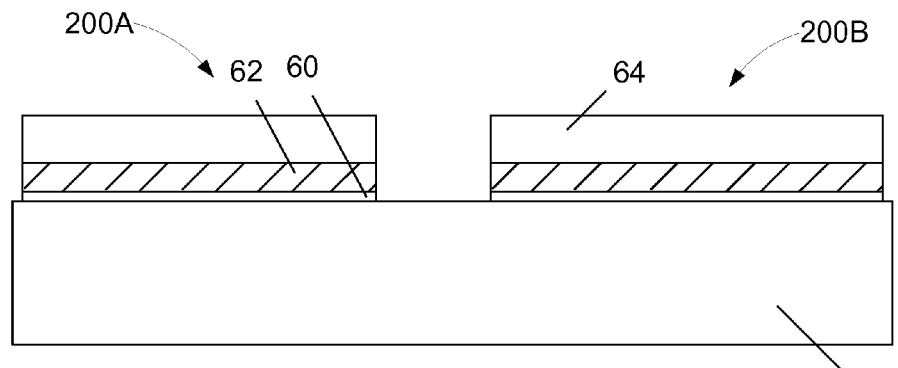
Figure 3C:
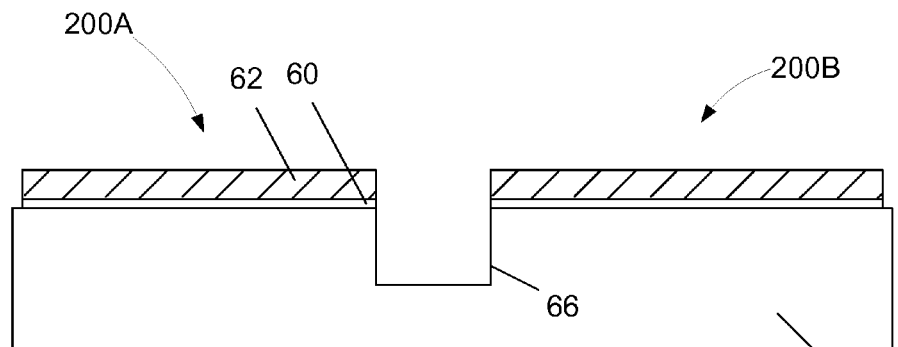

Thereafter, as shown in FIG. 3B, an etching process, such as a reactive ion etching process, is performed through the mask layer 64 to pattern the pad oxide layer 60 and the pad nitride layer 62. FIG. 3C depicts the device 200 after the masking layer 64 has been removed and an etching process, such as a reactive ion etching process, has been performed to form a trench 66 in the substrate 10 using the patterned pad oxide layer 60 and pad nitride layer 62 as an etch mask. For ease of illustration, the trench 66 is depicted as having a generally rectangular cross-section. In real-world devices, the sidewalls of the trench 66 will likely be somewhat inwardly tapered. The dimensions of the trench 66 may vary depending on the particular application. In current day devices, the trench 66 may have a depth of about 300-400 nm and a width of about 50-70 nm.

Figure 3D:
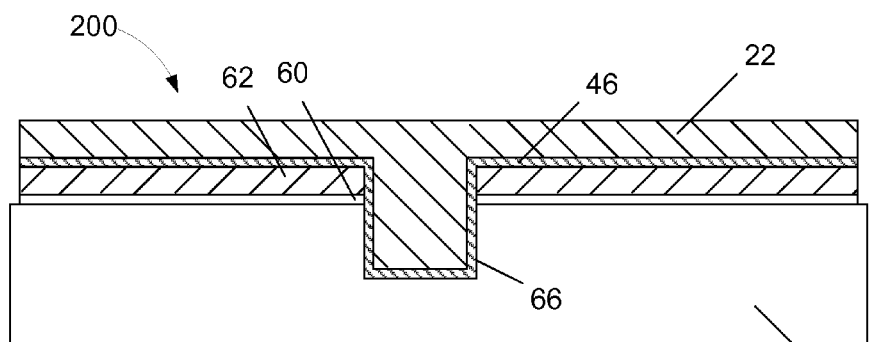
Figure 3E:
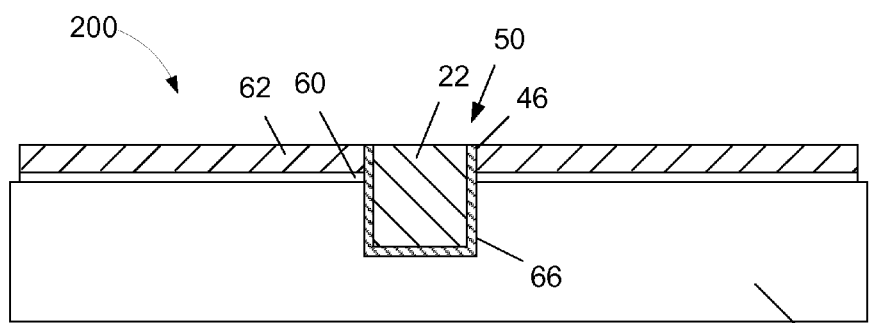
Figure 3F:
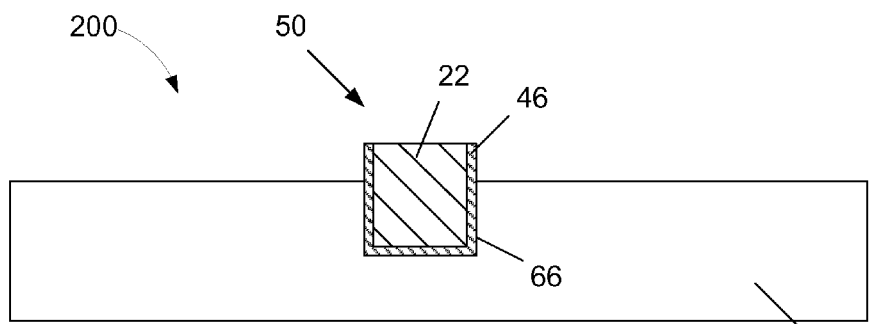

Next, as shown in FIG. 3D, a first conformal deposition process is performed to form a layer of insulating material 46 in the trench 66, and another process is performed to form a layer of insulating material 22 on the device 200 above the layer of insulating material 46 and to over-fill the trench 66. Next, as shown in FIG. 3E, a CMP process is performed to remove the portions of the layer of insulating material 22 and the layer of insulating material 46 positioned above the surface of the pad nitride layer 62. At some point after the insulating material 22 is positioned in the trench 66, the heating process 26 described above (FIGS. 1E-1F) may be performed at a temperature of about 300-1000° C. to densify the insulating material 22. Then, as shown in FIG. 3F, one or more etching processes, wet or dry, are performed to remove the pad nitride layer 62 and the pad oxide layer 60. The final isolation structure 50 is shown in FIG. 3F.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
   forming a plurality of spaced-apart trenches in a semiconducting substrate, said trenches defining a fin for said device, said fin having sidewalls;
   forming a layer of flowable oxide material in said trenches, said layer of flowable oxide material covering a lower portion of said fin but not an upper portion of said fin, thereby defining exposed upper sidewalls of the fin and covered lower sidewalls of said fin, said covered lower sidewalls having a height;
   forming at least one sidewall spacer on and in contact with said exposed upper sidewalls of said upper portion of said fin, wherein forming said at least one spacer comprises depositing a layer of spacer material on at least said exposed upper sidewalls of said upper portion of said fin and performing an etching process on said layer of spacer material, said at least one sidewall spacer being comprised of a material that is different than said layer of flowable oxide material in said trenches; and
   after forming said at least one sidewall spacer, and with said at least one sidewall spacer in position, performing a heating process in an oxidizing ambient to form a thermal oxide region on an entire height of said covered lower sidewalls of the lower portion of said fin and to densify said layer of flowable oxide material.

2. The method of claim 1, wherein forming said layer of flowable oxide material comprises performing one of a deposition process or a spin-coating process.

3. The method of claim 1, wherein said oxidizing ambient comprises at least one of steam and oxygen.

4. The method of claim 1, wherein forming said layer of flowable oxide material comprises:
   performing a deposition process to form said layer of flowable oxide material to a thickness such that it overfills said trenches; and
   performing an etching process to reduce said thickness of said layer of flowable oxide material such that an upper surface of said layer of flowable oxide material is positioned at a level that is below a level of an upper surface of said fin.

5. The method of claim 1, wherein forming said layer of flowable oxide material comprises performing a deposition process to form said layer of flowable oxide material such that an as-deposited upper surface of said layer of flowable oxide material is positioned at a level that is below a level of an upper surface of said fin.

6. The method of claim 1, wherein said thermal oxide region has a thickness that is less than an original thickness of said fin.

7. The method of claim 1, wherein said thermal oxide region has a thickness that is at least substantially equal to an original thickness of said fin.

8. The method of claim 1, wherein said heating process is performed at a temperature that falls within the range of about 300-1000° C. and at a pressure of about 760 Torr.

9. The method of claim 1, wherein said thermal oxide region has a substantially consistent width throughout the height of said fin.

10. A method of forming a FinFET device, comprising:
    forming a plurality of spaced-apart trenches in a semiconducting substrate, said trenches defining a fin for said device, said fin having sidewalls;
    after forming said plurality of spaced-apart trenches, forming a layer of insulating material in said trenches, said layer of insulating material covering a lower portion of said fin but not an upper portion of said fin, thereby defining exposed upper sidewalls of said fin and covered lower sidewalls of said fin, said covered lower sidewalls having a height;
    after forming said layer of insulating material, forming a protective sidewall spacer on and in contact with said exposed upper sidewalls of said upper portion of said fin, wherein forming said protective sidewall spacer comprises depositing a layer of spacer material on at least said exposed upper sidewalls of said upper portion of said fin and performing an etching process on said layer of spacer material, said protective sidewall spacer being comprised of a material that is different than said layer of insulating material in said trenches; and
    after forming said protective sidewall spacer, performing a heating process in an oxidizing ambient to form a thermal oxide region on an entire height of said covered lower sidewalls of said lower portion of said fin and to densify said layer of insulating material.

11. The method of claim 10, wherein forming said layer of insulating material comprises:
    performing a deposition process to form said layer of insulating material to a thickness such that it overfills said trenches; and
    performing an etching process to reduce said thickness of said layer of insulating material such that an upper surface of said layer of insulating material is positioned at a level that is below a level of an upper surface of said fin.

12. The method of claim 10, wherein forming said layer of insulating material comprises performing a deposition process to form said layer of insulating material such that an as-deposited upper surface of said layer of insulating material is positioned at a level that is below a level of said upper surface of said fin.

* * * * *

UNITED STATES PATENT AND TRADEMARK OFFICE
CERTIFICATE OF CORRECTION

PATENT NO. : 9,117,877 B2  
APPLICATION NO. : 13/350908  
DATED : August 25, 2015  
INVENTOR(S) : Xiuyu Cai et al.

Page 1 of 1

It is certified that error appears in the above-identified patent and that said Letters Patent is hereby corrected as shown below:

Claims
Col. 9, line 17 (claim 1, line 13), before "spacer" insert -- sidewall --.

Signed and Sealed this
Second Day of February, 2016

Michelle K. Lee
*Director of the United States Patent and Trademark Office*